(12) United States Patent
Kappes et al.

(10) Patent No.: US 7,386,280 B2
(45) Date of Patent: Jun. 10, 2008

(54) GAIN INSENSITIVE HIGH-PASS VGA

(75) Inventors: Michael S. Kappes, San Diego, CA (US); Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 447 days.

(21) Appl. No.: 11/246,579

(22) Filed: Oct. 7, 2005

(65) Prior Publication Data

US 2007/0077904 A1  Apr. 5, 2007

Related U.S. Application Data

(60) Provisional application No. 60/718,687, filed on Sep. 20, 2005.

(51) Int. Cl.
*H04B 1/06* (2006.01)
*H04B 7/00* (2006.01)

(52) U.S. Cl. .................. 455/73; 455/127.2; 455/243.1; 455/307; 330/278

(58) Field of Classification Search ............. 455/127.2, 455/232.1–253.2, 296, 307, 333; 330/278–285
See application file for complete search history.

(56) References Cited

U.S. PATENT DOCUMENTS

| 5,786,730 | A  | * | 7/1998 | Hadley ......................... 330/59 |
| 5,867,777 | A  | * | 2/1999 | Yamaji et al. ............ 455/234.1 |
| 6,909,323 | B2 | * | 6/2005 | Ueno et al. .................... 330/86 |
| 7,020,449 | B2 | * | 3/2006 | Shi .......................... 455/234.1 |
| 7,302,246 | B2 | * | 11/2007 | Tseng et al. ................. 330/200 |
| 2005/0225388 | A1 | * | 10/2005 | Ramachandran et al. ... 330/150 |

* cited by examiner

*Primary Examiner*—Simon Nguyen
(74) *Attorney, Agent, or Firm*—Garlick, Harrison & Markison; James A. Harrison

(57) ABSTRACT

An integrated circuit radio transceiver and method therefor includes a high-pass variable gain amplifier (HPVGA) operably disposed within one of the transmitter and the receiver front ends operable to provide a linear variable gain and a substantially constant high-pass frequency corner that does not vary with changes in gain level settings. The HPVGA includes an amplifier operably disposed to receive an input signal and to produce an amplified output based upon the input signal, an adjustable resistance block operable to adjust resistance based upon a gain control input and corner drift compensation block operably disposed to provide corner frequency compensation at the input terminal of the amplifier that is further coupled to receive the input signal from the adjustable resistance block.

21 Claims, 6 Drawing Sheets

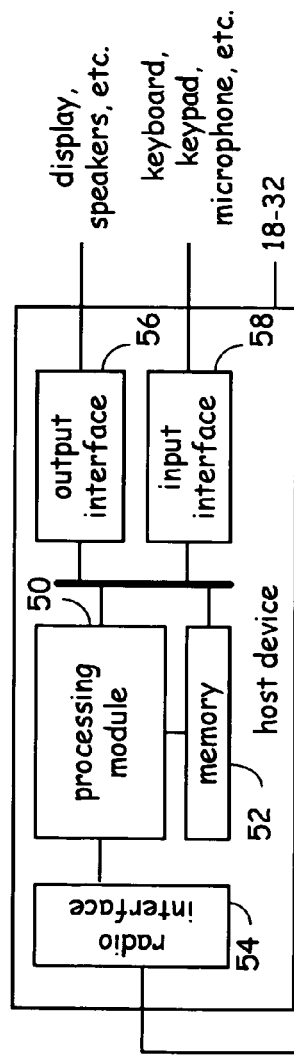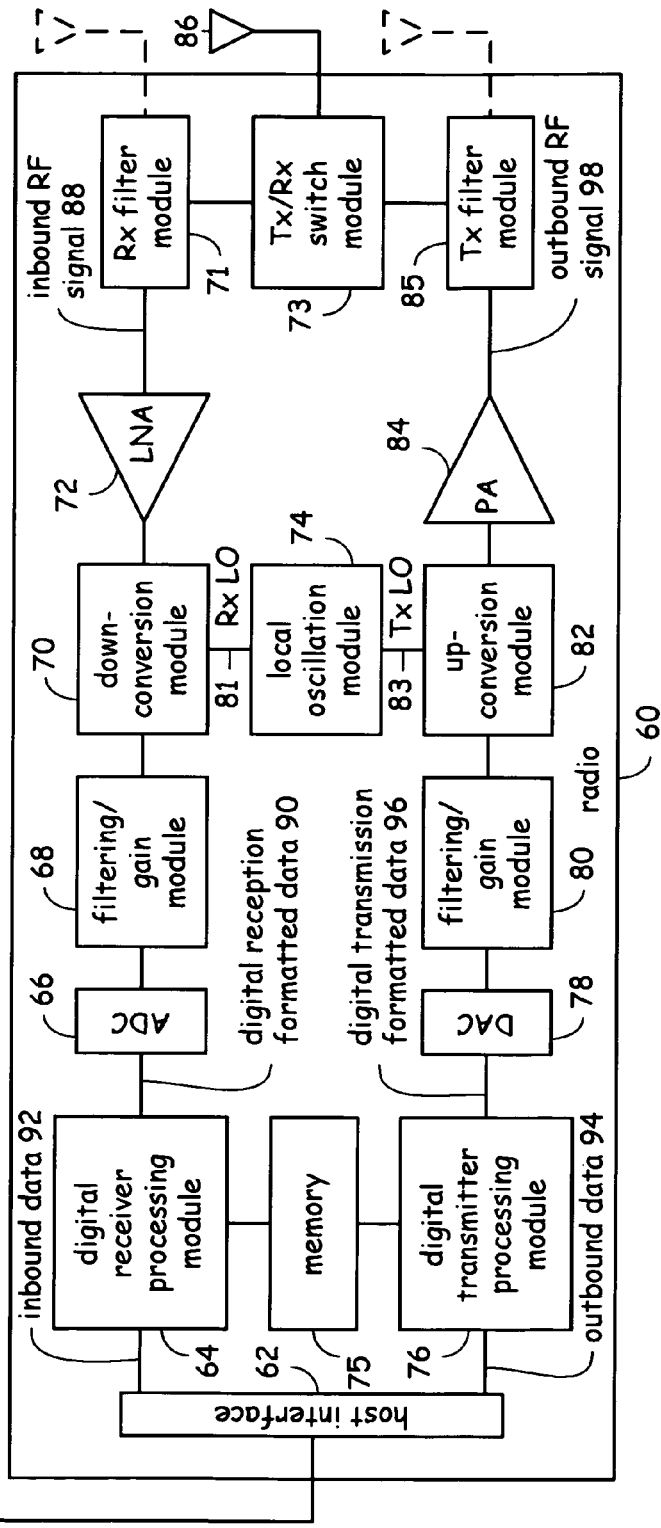
FIG. 2

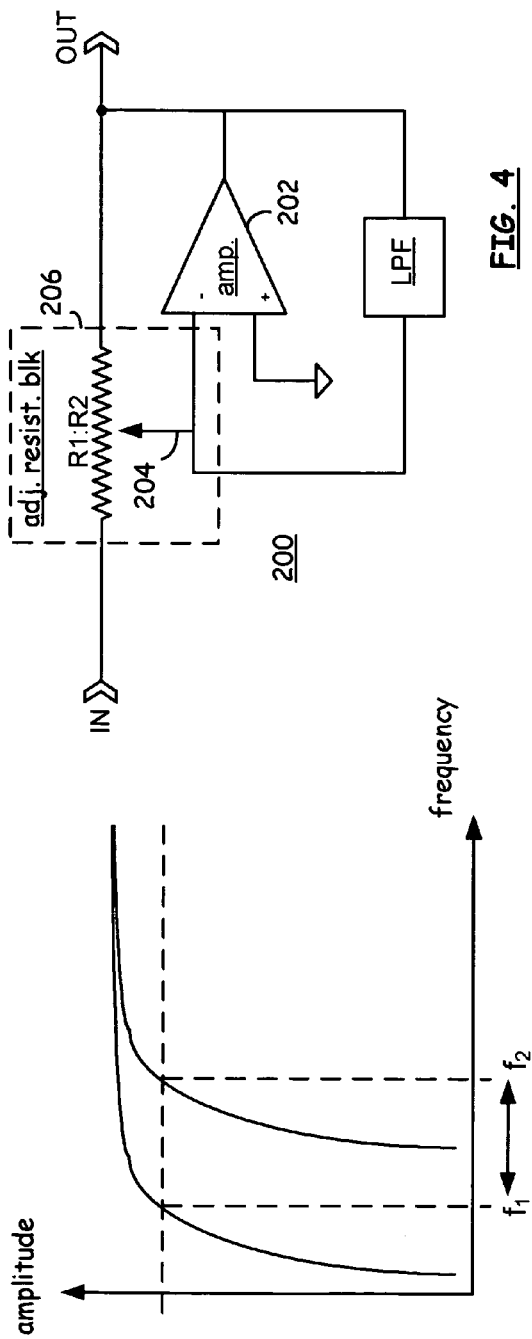
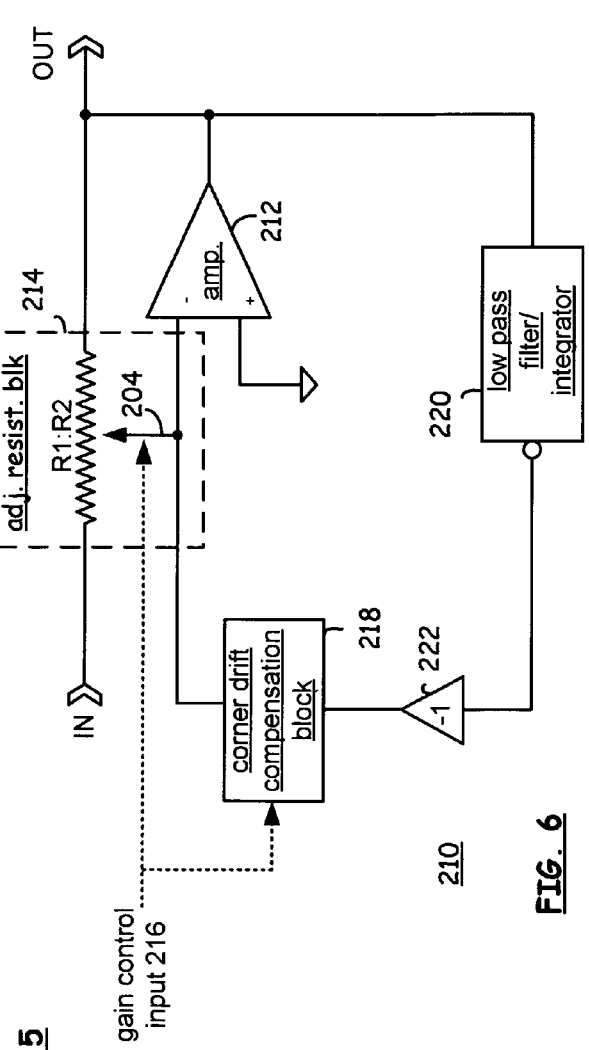
FIG. 4
FIG. 5
FIG. 6

GAIN INSENSITIVE HIGH-PASS VGA

CROSS-REFERENCE TO RELATED APPLICATION

This application claims priority to and incorporates by reference U.S. Provisional Application entitled, "Gain Insensitive High-Pass VGA", having a Ser. No. of 60/718,687 and a filing date of Sep. 20, 2005.

BACKGROUND

1. Technical Field

The present invention relates to wireless communications and, more particularly, to circuitry for filtering and amplifying signals.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bi-polar circuitry, allowing for large signal swings and linear transmitter component behavior. Therefore, many legacy baseband processors employ analog interfaces that communicate analog signals to and from the radio processor.

In conventional designs of radio receivers, and especially of integrated circuit radio receivers with a large baseband frequency filter, direct current (DC) offset is a known problem. With multiple gain stages in a receiver front end, the DC offset can saturate the linear range of the gain stages. A significant problem that exists is that a typical high-pass transfer function for a feedback based amplifier with a resistor in the feedback loop as well as at the input is that of the high-pass corner frequency changing as a function variable gain amplifier (VGA) gain levels within a high-pass VGA. The greater the change in VGA gain, the greater the change in the high pass corner frequency. Typically, the corner frequency of the high-pass filter amplifier increases with the increase in gain. The undesirable consequence is that more of a DC or low frequency signal is amplified by the gain stages resulting in lower filtering or blocking of such signal components as the corner frequency increases. Additionally, overall bandwidth is lowered when the high-pass frequency corner changes.

In many systems, the final analog bandwidth is sampled and converted to digital form with an analog-to-digital converter. A subsequent digital filter may then be used to recover the desired analog signal bandwidth and impart the required DC offset cancellation. The problem with this approach, however, is that there is considerable gain in the analog processing path such that cumulative offsets will saturate the intermediate stages in the filter chain. Thus, even in a system that employs a form of DC offset cancellation, the drift of the high frequency corner as described may result in lower frequency components not being cancelled which would have been cancelled without frequency drift. Thus, these DC offset components that are not cancelled may be subsequently amplified at each gain stage. In this situation, the digital form signal produced to the baseband processor or digital filters is substantially saturated thereby limiting the ability of the baseband processor to provide digital compensation. Thus, it is desirable to provide adequate compensation in the analog processing path such that cumulative DC offset does not saturate downstream amplifiers or analog-to-digital converters.

One approach to solve the problem of the high-pass corner movement is to use a very slow DC offset cancellation system that has a very low high-pass corner. This approach, however, has the drawback that there is significant delay while an offset cancellation loop settles. Moreover, other approaches that may provide reasonable linearity and variable gain are low bandwidth systems. Thus, there is a need for a system or design that provides a high-corner that provides filtering at the desired low frequency without movement due to increases in and is independent of amplifier gain and provides linearity over a wide frequency bandwidth. For example, it is desirable to provide linearity over a 20-30 MHz bandwidth with linearity over a gain of 60 dB in a variable gain amplifier.

Moreover, in an integrated circuit utilizing MOSFETs as configured and biased to operate as resistors, or, alternatively, in an integrated circuit using MOSFET switches to switch resistances in and out of connectivity to set the gain, process variations in generating bias signals for the MOSFET switch or resistor result in non-linear response due to square-law voltage-current relationships within MOSFET devices as is known by one of average skill in the art. It is desirable, therefore, to avoid the effects of non-linearity known to exist for such MOSFET resistors and MOSFET switches and to provide adequate filtering of low frequency components without frequency drift that results from gain level changes.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which:

FIG. 2 is a schematic block diagram illustrating a wireless communication host device and an associated radio;

FIG. 4 illustrates one embodiment of a variable gain amplifier that may be used in a radio receiver;

FIG. 5 is a frequency response diagram that illustrates an exemplary frequency response to a gain change in a variable gain amplifier;

FIG. 6 is a functional block diagram of a variable gain amplifier with corner drift compensation according to one embodiment of the invention;

DETAILED DESCRIPTION OF THE DRAWINGS

Figure 1:
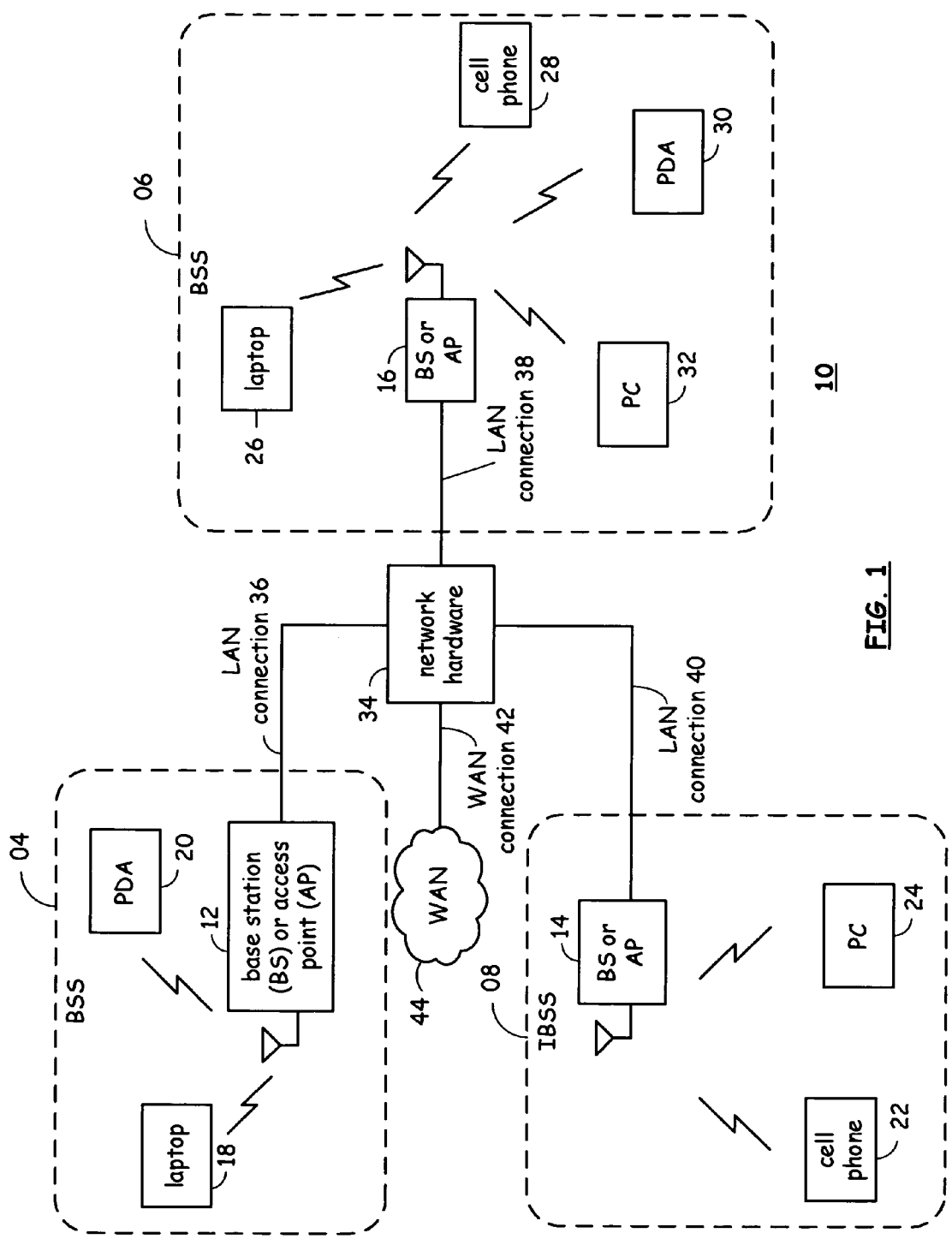
FIG. 1 is a functional block diagram illustrating a communication system that includes circuit devices and network elements and operation thereof according to one embodiment of the invention.

FIG. 1 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 2-10.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10 to an external network element such as WAN 44. Each of the base stations or access points 12-16has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

FIG. 2 is a schematic block diagram illustrating a wireless communication host device 18-32 and an associated radio 60. For cellular telephone hosts, radio 60 is a built-in component. For personal digital assistants hosts, laptop hosts, and/or personal computer hosts, the radio 60 may be built-in or an externally coupled component.

As illustrated, wireless communication host device 18-32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86 operatively coupled as shown. The antenna 86 is shared by the transmit and receive paths as regulated by the Tx/Rx switch module 73. The antenna implementation will depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 18-32 via host interface 62. Host interface 62 routes outbound data 94 to digital transmitter processing module 76, which processes outbound data 94 in accordance with a particular wireless communication standard or protocol (e.g., IEEE 802.11(a), IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering/gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Power amplifier 84 amplifies the RF signal to produce an outbound RF signal 98, which is filtered by transmitter filter module 85. The antenna 86 transmits outbound RF signal 98 to a targeted device such as a base station, an access point and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 bandpass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering/gain module 68. Filtering/gain module 68 may be implemented in accordance with the teachings of the present invention to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 18-32 via radio interface 54.

As one of average skill in the art will appreciate, the wireless communication device of FIG. 2 may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit.

Memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. One embodiment of the present invention reduces the noise by providing a selectable pole low pass filter in current mirror devices formed within the one or more integrated circuits.

Local oscillation module 74 includes circuitry for adjusting an output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 82 and down-conversion module 70 are implemented to perform direct conversion between baseband and RF, it is understood that the principles herein may also be applied readily to systems that implement an intermediate frequency conversion step at a low intermediate frequency.

Figure 3:
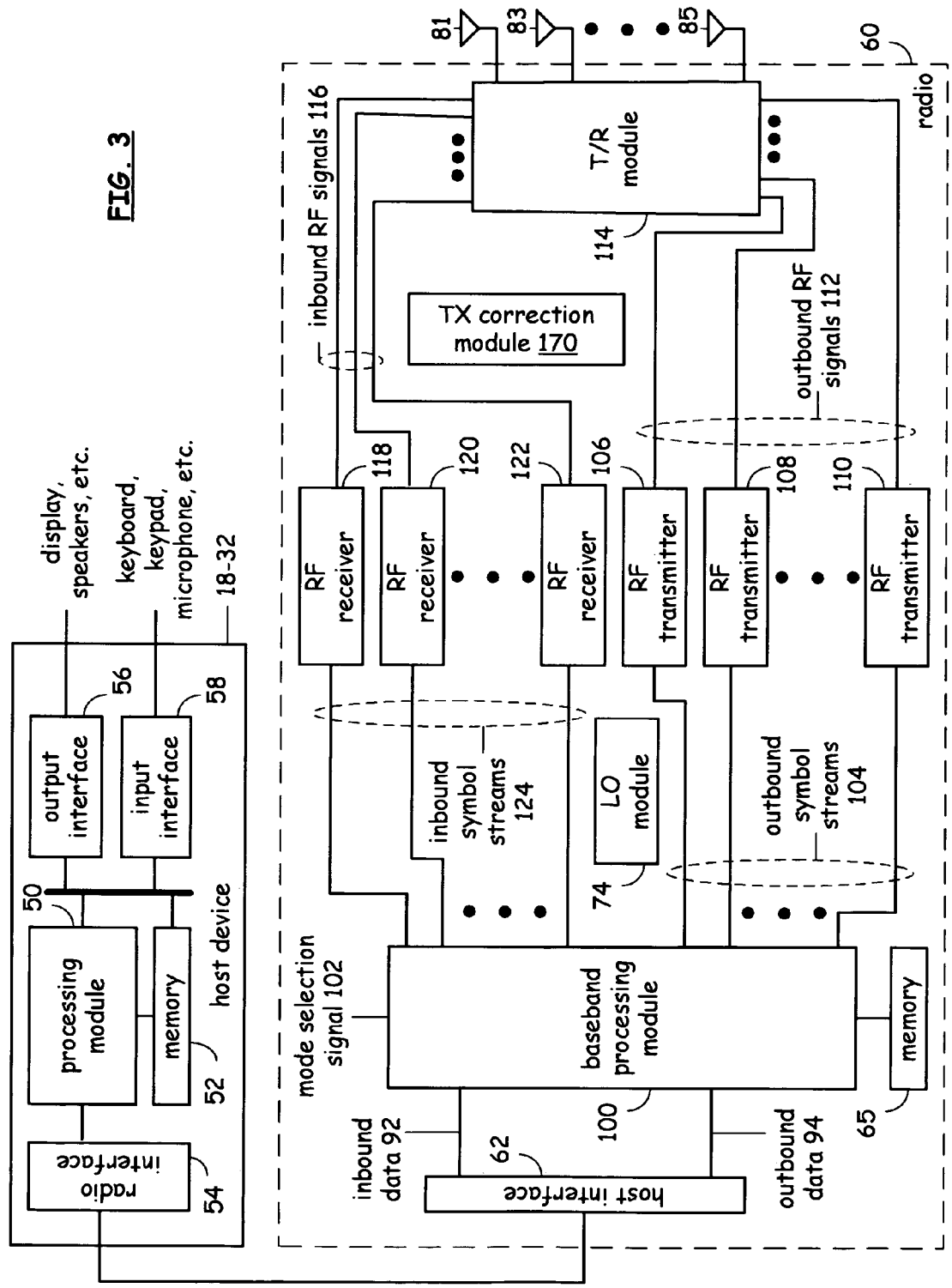
FIG. 3 is a schematic block diagram illustrating a wireless communication device that includes a host device and an associated radio.

FIG. 3 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-120, and a local oscillation module 74. The baseband processing module 100, in combination with operational instructions stored in memory 65, executes digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or deserambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 100 may be implemented using one or more processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 100 receives the outbound data 94 and, based on a mode selection signal 102, produces one or more outbound symbol streams 104. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM and/or 64 QAM. The mode selection signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode selection signal 102 may further indicate a power spectral density mask value and a number of antennas to be initially used for a MIMO communication.

The baseband processing module 100, based on the mode selection signal 102 produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode selection signal 102 indicates 2, 3 or 4 antennas, the baseband processing module 100 will produce 2, 3 or 4 outbound symbol streams 104 from the outbound data 94.

Depending on the number of outbound symbol streams 104 produced by the baseband processing module 100, a corresponding number of the RF transmitters 106-110 will be enabled to convert the outbound symbol streams 104 into outbound RF signals 112. In general, each of the RF transmitters 106-110 includes a digital filter and upsampling module, a digital-to-analog conversion module, an analog filter module, a frequency up conversion module, a power amplifier, and a radio frequency bandpass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122. The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 3 may be implemented using one or more integrated circuits. For example, the host device may be implemented on a first integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

FIG. 4 illustrates one embodiment of a variable gain amplifier that may be used in a radio receiver. As may be seen, a variable gain amplifier 200 includes an amplifier 202 with an amplifier input (negative input) that is operably coupled to a functional tap point 204 of an adjustable resistor block 206 that includes two resistive portions R1 and R2 wherein R2 increases as R1 decreases and vice-versa. In traditional circuits, a potentiometer included a tap point for a conductive element that was adjustable to create a desired resistance. In integrated circuit designs, the functionality of a tap point is replicated through selective coupling through MOSFET switching or other switching techniques to a specified location with a resistive block. While there are many possible embodiments, one embodiment includes a resistor ladder in which a switch configuration allows access to a selectable point within the ladder to functionally duplicate the traditional potentiometer. Thus, references herein to tap points may be taken figuratively as well as literally.

While the system of FIG. 4 provides good linearity which is desirable in an amplifier stage, the system of FIG. 4 suffers from an undesirable frequency response. FIG. 5 is a frequency response diagram that illustrates an exemplary frequency response to a gain change in a variable gain amplifier. As R2 increases and R1 decreases thereby substantially increasing the gain, the high-pass frequency corner shifts. Referring to FIG. 5, it may be seen that two frequency curves are shown having frequency corners defined at $f_1$ and $f_2$. The frequency curve at $f_2$ represents a curve for the VGA of FIG. 4 with an increased gain setting. It is desirable, therefore, to provide additional or increased frequency gain without shifting the frequency corner from $f_1$, to $f_2$ and, therefore, without reducing bandwidth of the variable gain amplifier. Referring back to FIG. 4, it should be noted that the level of attenuation at DC, or the accuracy of the cancellation is determined by the accuracy of the analog components, namely the loop gain of the system determined by the amplifier's open loop gain. The main VGA must have enough DC gain to properly perform subtraction to the required level. So instead of rolling off to negative infinity (as a pure high-pass filter), the curve flattens out at the limit of the loop gain of the system (open loop gain of amplifier minus the gain of the VGA).

FIG. 6 is a functional block diagram of a variable gain amplifier with corner drift compensation according to one embodiment of the invention. A high-pass variable gain amplifier (HPVGA) 210 is operable to provide a linear variable gain and a substantially constant high-pass frequency corner that does not vary with changes in gain level settings. HPVGA 210 includes an amplifier 212 operably disposed to receive an input signal and to produce an amplified output based upon the input signal. Amplifier 212 receives the input signal from an adjustable resistance block 214. Adjustable resistance block 214 is operable to adjust resistance based upon a gain control input 216. Generally, the adjustable resistance block 214 is operably disposed across input and output terminals of the amplifier 212 whereby adjustments to the resistance determine a gain level of the amplified output. As may be seen, adjustable resistance block 214 defines a first resistive portion R1 and a second resistive portion R2. R1 is disposed between an input that is operably coupled to receive an input signal while R2 is disposed across the input and output terminals of amplifier 212.

Generally, gain of the HPVGA of FIG. 6 is based upon a ratio of R2 to R1. Thus, increases in R2, which result in decreases to R1, result in increases in gain. Similarly, decreases in R2 and increases in R1 result in decreases in gain. As discussed above, however, such adjustments result in drift of a low corner frequency of the HPVGA. Thus, HPVGA 210 includes a corner drift compensation block 218 operably disposed to provide corner frequency compensation at the input terminal of the amplifier 212.

As may be seen, the compensation is provided to the same input terminal of amplifier 212 that is further coupled to receive the input signal from the adjustable resistance block 214. In the described embodiment of the invention, HPVGA 210 corner drift compensation block 218 produces the corner frequency compensation based up on the gain control input 216. Generally, the corner drift compensation block 218 generates a third resistive value R3 that remains equal to the second resistive value. The first, second and third resistive values all vary based upon the gain control input.

As described above, R1 changes in an inverse direction relative to R2 while R2 and R3 maintain proportional values and change in the same direction. In other words, R2 and R3 increase and decrease at the same time based upon the gain control input while R1 decreases or increases based upon the same gain control input. In one embodiment, R2 and R3 are similar and maintain substantially similar values. In another embodiment, R2 and R3 are scaled and maintain a proportional ratio but continue to increase and decrease in the same direction.

HPVGA 210 further includes a low pass filter and integrator 220 operably coupled to receive and integrate the amplified output from the output terminal of the amplifier 212 to produce a low pass integrated output. The low pass filter and integrator 220 produces the low pass integrated output to a negation block 222. Negation block 222 is operably disposed to produce a negated low frequency integrated output to the corner drift compensation block 218 based upon the low frequency integrated output wherein the corner drift compensation block is operable to produce at least a magnitude divided portion of the negated low frequency integrated output to the input terminal of the amplifier. In an alternate embodiment, low pass filter and integrator 220 is replaced by a low pass filter whose output is produced to the negation block.

In operation, the output of amplifier 212 is produced to low pass filter and integrator 220 which is operable integrate low frequency components of the output of amplifier 212. The integrated low frequency components are then produced to the negation block 222 which negates the integrated low frequency components. In the described embodiment, low pass filter and integrator produces a negative gain. Thus, the negated and integrated low frequency components produced by negation block 222 are then negated to create a positive signal that is produced to corner drift compensation block 218 wherein at least a portion of the negated and integrated low frequency signal components are produced to the input of amplifier 212 where they are subtracted from the input signal received from adjustable resistance block 214. As such, the negative feedback of the low-pass filter and integrator to the overall system is a result of adding a positive signal at a negative terminal of the amplifier. In an alternate embodiment, the low pass filter and integrator are operably constructed to produce a feedback signal with a positive gain and the negation block is not necessary so long as the feedback signal is produced to the negative input of the amplifier as shown in FIG. 6. As such, a low frequency component of a signal, for example, a DC offset is notched out and subtracted from the input. Within certain limits of the amplifier gain of amplifier 212, the DC offset is fully subtracted as will be explained in greater detail below.

Figure 7:
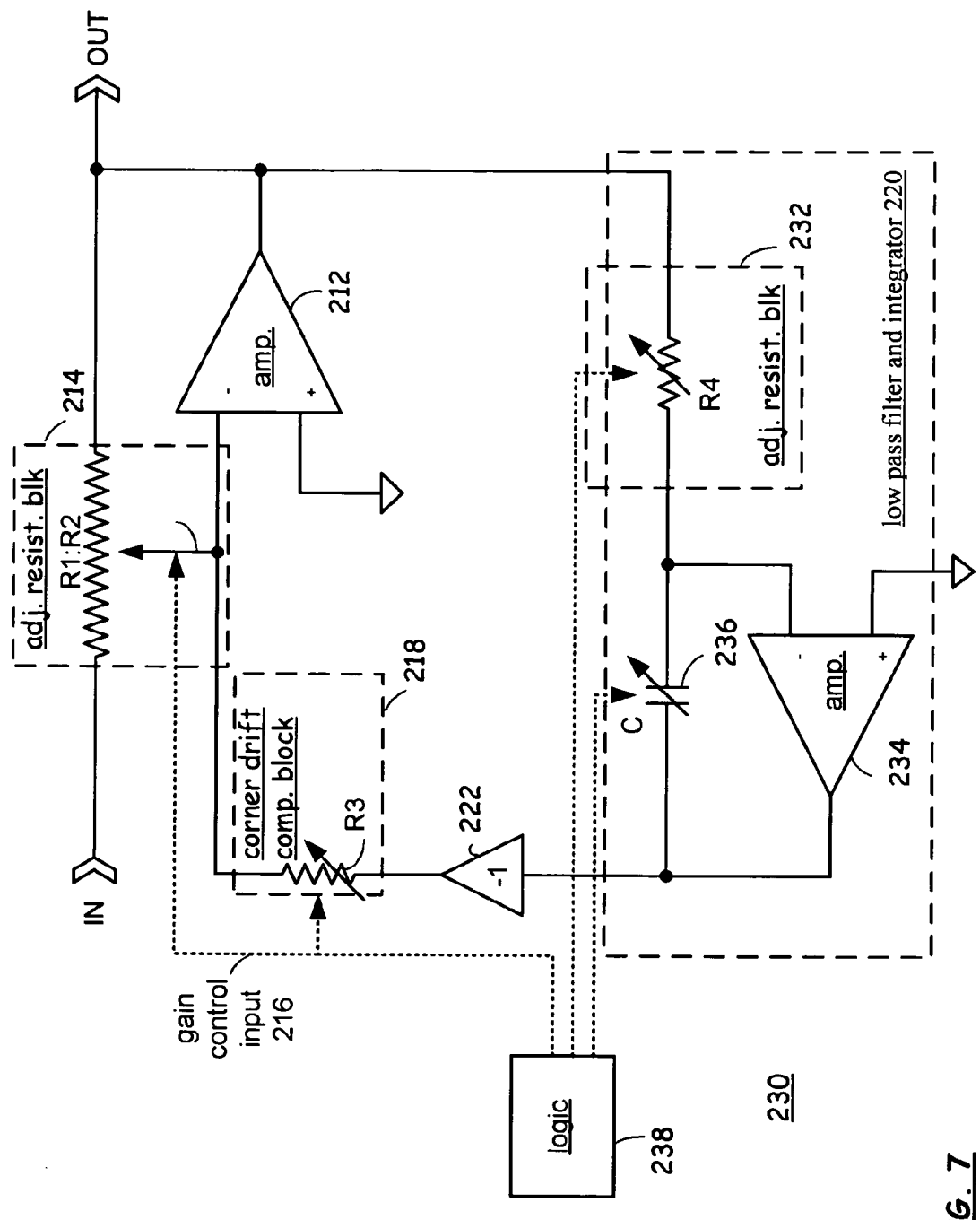
FIG. 7 is a functional schematic diagram of a gain insensitive high-pass variable gain amplifier formed according to one embodiment of the invention.

FIG. 7 is a functional schematic diagram of a gain insensitive high-pass variable gain amplifier formed according to one embodiment of the invention. Referring now to FIG. 7, a high-pass variable gain amplifier (HPVGA) 230 that is operable to provide a linear variable gain and a substantially constant high-pass frequency corner that does not vary with changes in gain level settings includes an amplifier is shown. The HPVGA 230 is operably disposed to receive an input signal and to produce an amplified output based upon the input signal. HPVGA 230 includes an adjustable resistance block 214 that is operable to adjust resistance based upon a gain control input. The adjustable resistance block 214 is operably disposed across input and output terminals of an amplifier 212 whereby adjustments to the resistance of the adjustable resistance block 214 determine a gain level of the amplified output produced by amplifier 212. HPVGA 230 further includes a corner drift compensation block 218 operably disposed to provide corner frequency compensation to the input terminal of the amplifier 212. The input terminal of amplifier 212 is further operably coupled to receive the input signal from the adjustable resistance block 214. The corner drift compensation block 218 produces the corner frequency compensation based up on the gain control input that is also received by adjustable resistance block 214.

Adjustable resistance block 214 defines first and second resistive values that increase and decrease in an inverse manner based upon tap point selections. As may be seen, the output of amplifier 212 generates a signal to the input of amplifier 212 in a feedback loop through the portion of adjustable resistance block 214 labeled as R2 and through the tap point of adjustable resistance block 214. The input signal is produced to the input of amplifier 212 by way of the portion of adjustable resistance block 214 labeled as R1 and through the tap point as shown in FIG. 7.

The corner drift compensation block 218 generates a third resistive value R3 that remains equal to the second resistive value R2 based upon the gain control input and changes in a similar direction based upon changes in the gain control input which drives selection of new tap points. In one embodiment of the invention, the corner drift compensation block 218 is similar in sizing/scaling to adjustable resistance block 214. Thus, the value R2 of adjustable resistance block 214 remains equal to the value of R3 of corner drift compensation block 218 as the gain control input 216 prompts changes in the selected tap point. In an alternate embodiment, the resistive values of the corner drift compensation block 218 are scaled in relation to the resistive values of adjustable resistance block 214. As such, R3 is proportional relative to R2 in a ratio other than 1:1 (as in the case of the prior described embodiment where the corner drift compensation block and the adjustable resistance block are sized/scaled equally).

HPVGA 230 includes, in one embodiment of the invention, a low pass filter and integrator 220 that is operably coupled to receive and integrate an amplified output produced from an output terminal of amplifier 212. Low pass filter and integrator 220 is operable to generate a low frequency integrated output. The low frequency integrated output is produced to a negating block 222. Negating block 222, in turn, negates the low frequency integrated output and produces the negated low frequency integrated output to the corner drift compensation block 218. In the described embodiment, the negated low frequency integrated output is conducted through the corner drift compensation block and is produced to amplifier 212 wherein the negated low frequency integrated output is subtracted from the input signal that is also received at the input of the amplifier 212. In terms of voltage drops across the corner drift compensation block and the combination of the adjustable resistance block and the amplifier, at least a portion of the negated low frequency integrated output is produced to the amplifier input. In the described embodiment, the adjustable resistance block comprises a first resistive portion (R1) operably disposed between an input of the HPVGA and the amplifier input and a second resistive portion (R2) operably disposed between the amplifier output and the amplifier input. The gain is of the HPVGA is a function of a ratio between R2 and R1. The corner drift compensation block comprises a third resistive portion (R3) operably disposed between the amplifier input and an output of the negation block wherein the corner frequency of the HPVGA is a function of a ratio between R2 and R3 and further wherein R2 and R3 maintain substantially proportional resistive values based upon the gain control input.

The HPVGA 230, and, more specifically, the low pass filter and integrator 220 comprises a second adjustable resistance block 232, a second amplifier 234 and an adjustable capacitor block 236 wherein the second adjustable resistance block 232 is operably disposed between an output of the first amplifier 212 and an input of the second amplifier 234 and further wherein the adjustable capacitor block 236 is operably disposed across an output of the second amplifier 234 and the input of the second amplifier 234. While FIG. 7 illustrates an adjustable capacitor, it should be understood that what is shown represents an array or ladder of capacitors having one or more selectable capacitors to provide a selectable total capacitance value.

The above described configuration for the low pass filter and integrator 220 provides an integration function in addition to a low pass filter function. The adjustable capacitor block 236 and the adjustable resistance block 232 are jointly operable to define a low pass corner frequency. Their coupling to amplifier 234 provides, therefore, a low-pass integration function.

HPVGA 230 further includes logic 238 for generating the gain control input that is produced to adjustable resistance block 214 and to corner drift compensation block 218 to set the resistance value as described previously to set the gain level of the amplifier while maintaining a reasonably stable corner frequency. Additionally, logic 238 is operable to generate and does generate control signals to set the desired capacitance values and resistance values within capacitor block 236 and adjustable resistance block 232.

The corner frequency is determined by:

$$f_{3\ dB} = (R_2/(R_3 * R_4 * C)) * 1/(2\pi) \tag{1}$$

As has been described before, R3 increases and decreases with R2. Accordingly, as may be seen from the above equation (1) above, while R2 sets the gain as described before, equation (1) explains why the corner frequency remains constant if R2 and R3 are similar in sizing, scaling and magnitude and change by equal amounts in response to the gain control signal. As may also be seen from equation (1), the corner frequency is a function of settings for R4 and C (adjustable resistance block 232 and capacitance block 236 in FIG. 7). Thus, logic 238 is operable to provide the gain control input 216 to set the gain without adjusting the corner frequency and is further operable to set control signals to select a desired resistance value within adjustable resistance block 232 and to select a desired capacitance value from capacitance block 236 to set the corner frequency. It should be noted, therefore, that C is varied to adjust low pass characteristics of the low pass filter as well as the corner frequency of the filter. In the described embodiment corner drift compensation block 218 is an exact replica of adjustable resistance block 214 so that the taps of blocks 214 and 218 remain matched based upon receiving gain control input 216 which therefore results in R2 and R3 remaining matched. In this described embodiment, the tap terminal adjustable resistance block 214 is tied to the input (R1) so that the value of R3 tracks the value of R2 and R1 is shorted effectively for corner frequency calculation purposes.

An additional consideration of the embodiment of the invention that merits consideration is the DC offset cancellation range. Generally, the maximum magnitude of a signal that may be cancelled (subtracted from the input of amplifier 212 as previously described) is equal to:

$$V_{cancellation} = V_{input} * (R_1/R_3) \qquad (2)$$

Thus, since R3 varies with R2 as described before, equation (2) is accurate so long as R2 is greater than R1. When R2 is less than R1, the DC offset cancellation is not limited by the structure of the embodiment of FIGS. 6 or 7. Here, for example, if R1/R3 is equal to ¼, then the maximum amount of DC offset cancellation is limited to ¼ of an input signal peak-to-peak range.

Figure 8:
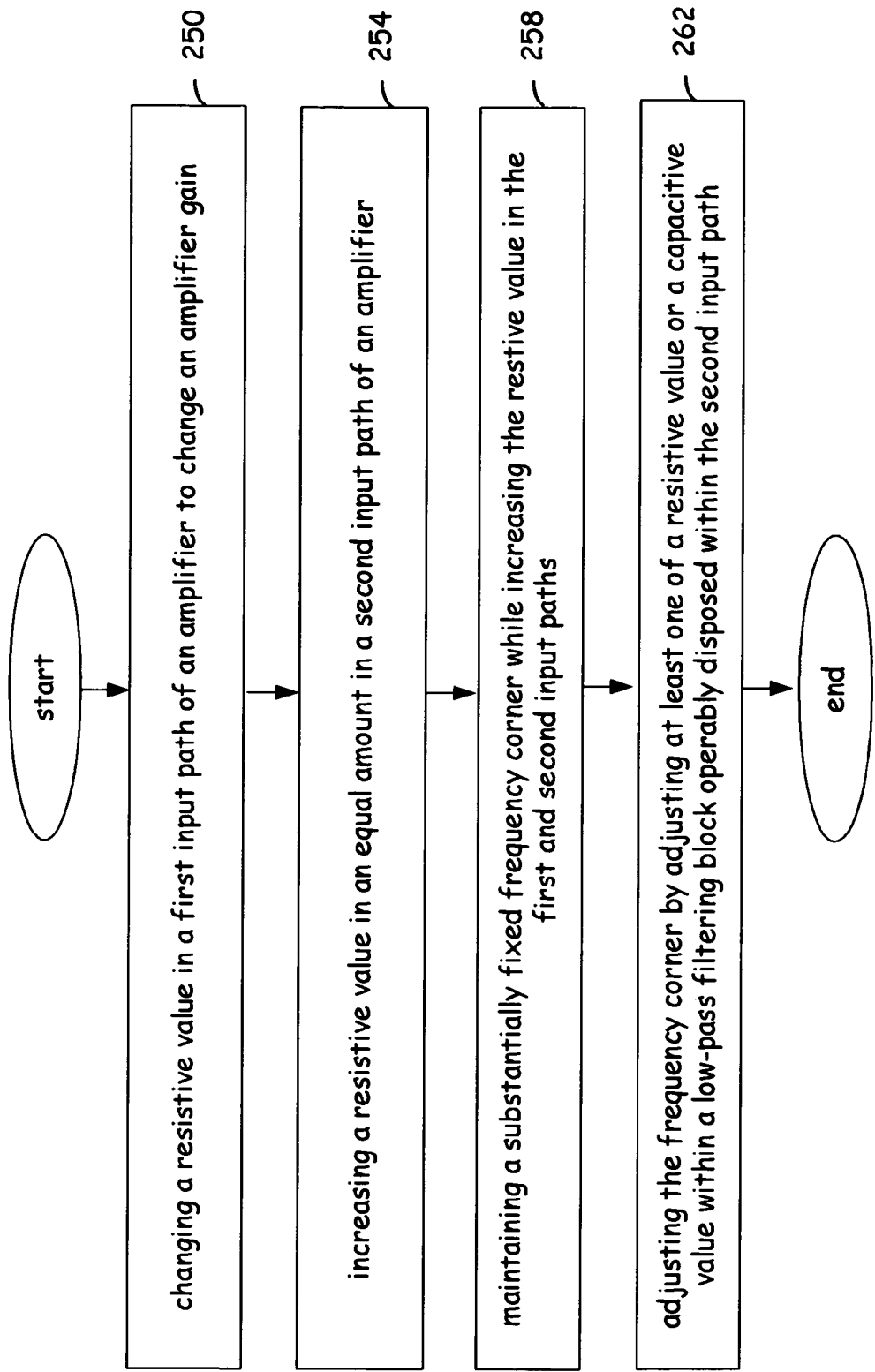
FIG. 8 is a flow chart of a method according to one embodiment of the invention.

In the described embodiment above, resistor 232 is used to set a corner frequency while the corner drift compensation block 218 is used to compensate for changes to the adjustable resistance block used to change the amplifier gain. In alternate embodiments, however, resistor 232 or other resistors in the second feedback path may be used to track changes in the adjustable resistance block to avoid frequency drift based upon gain changes. Thus, the resistance of the corner drift compensation block 218 along with resistor 232 may be used to set the corner frequency. In yet another embodiment, FIG. 8 is a flow chart of a method according to one embodiment of the invention. Referring now to FIG. 8, the method includes changing a resistive value in a first input path of an amplifier to change an amplifier gain (step 250). Thus, the method implicitly includes changing the resistive value in a positive direction to increase the resistance and therefore the gain as well as decreasing the resistance to decrease the gain. The method further includes changing a resistive value in an equal amount and in the same positive or negative direction in a second input path of an amplifier (step 254). The method also includes maintaining a substantially fixed frequency corner while changing the restive value in the first and second input paths (step 258). At any point during the above method steps, the invention further includes adjusting the frequency corner by adjusting at least one of a resistive value or a capacitive value within a low-pass filtering block operably disposed within the second input path (step 262).

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. An integrated circuit radio transceiver, comprising:
    baseband processor for processing ingoing and outgoing digital communication signals;
    transmitter front end for processing and transmitting outgoing RF signals based upon the outgoing digital communication signals;
    receiver front end for receiving ingoing RF signals and for processing the ingoing RF signals to produce the ingoing digital communication signals;
    a high-pass variable gain amplifier (HPVGA) operably disposed within one of the transmitter and the receiver front ends operable to provide a linear variable gain and a substantially constant high-pass frequency corner that does not vary with changes in gain level settings, the HPVGA including:
    an amplifier operably disposed to receive an input signal and to produce an amplified output based upon the input signal;
    an adjustable resistance block operable to adjust resistance based upon a gain control input wherein the adjustable resistance block is operably disposed across input and output terminals of the amplifier whereby adjustments to the resistance determine a gain level of the amplified output; and
    corner drift compensation block operably disposed to provide corner frequency compensation at the input terminal of the amplifier that is further coupled to receive the input signal from the adjustable resistance block.

2. The integrated circuit radio transceiver of claim 1 wherein the corner drift compensation block produces the corner frequency compensation based up on the gain control input.

3. The integrated circuit radio transceiver of claim 1 wherein the adjustable resistance block defines first and second resistive values and further wherein the corner drift compensation block generates a third resistive value that remains equal to the second resistive value wherein the first, second and third resistive values all vary based upon the gain control input.

4. The integrated circuit radio transceiver of claim 1 wherein the corner drift compensation block is formed to be similar to the adjustable resistance block.

5. The integrated circuit radio transceiver of claim 1 further including a low pass filter and integrator operably coupled to receive and integrate the amplified output from the output terminal of the amplifier to produce a low frequency integrated output.

6. The integrated circuit radio transceiver of claim 5 further including a negation block operably disposed to produce a negated low frequency integrated output to the corner drift compensation block based upon the low frequency integrated output wherein the corner drift compensation block is operable to produce at least a magnitude divided portion of the negated low frequency integrated output to the input terminal of the amplifier.

7. A high-pass variable gain amplifier (HPVGA) operable to provide a linear variable gain and a substantially constant high-pass frequency corner that does not vary with changes in gain level settings, the HPVGA including:
   an amplifier operably disposed to receive an input signal and to produce an amplified output based upon the input signal;
   an adjustable resistance block operable to adjust resistance based upon a gain control input wherein the adjustable resistance block is operably disposed across input and output terminals of the amplifier whereby adjustments to the resistance determine a gain level of the amplified output; and
   corner drift compensation block operably disposed to provide corner frequency compensation at the input terminal of the amplifier that is further coupled to receive the input signal from the adjustable resistance block.

8. The HPVGA of claim 7 wherein the corner drift compensation block produces the corner frequency compensation based up on the gain control input.

9. The HPVGA of claim 7 wherein the adjustable resistance block defines first and second resistive values and further wherein the corner drift compensation block generates a third resistive value that remains equal to the second resistive value wherein the first, second and third resistive values all vary based upon the gain control input.

10. The HPVGA of claim 7 wherein the corner drift compensation block is formed to be similar to the adjustable resistance block.

11. The HPVGA of claim 7 further including a low pass filter and integrator operably coupled to receive and integrate the amplified output from the output terminal of the amplifier to produce a low frequency integrated output.

12. The HPVGA of claim 11 further including a negation block operably disposed to produce a negated low frequency integrated output to the corner drift compensation block based upon the low frequency integrated output wherein the corner drift compensation block is operable to produce at least a magnitude divided portion of the negated low frequency integrated output to the input terminal of the amplifier.

13. The HPVGA of claim 12 wherein the adjustable resistance block comprises a first resistive portion (R1) operably disposed between an input of the HPVGA and the amplifier input and a second resistive portion (R2) operably disposed between the amplifier output and the amplifier input wherein gain is of the HPVGA is a function of a ratio between R2 and R1 and further wherein the first and second resistive portions are part of a first adjustable resistive block.

14. The HPVGA of claim 12 wherein the corner drift compensation block comprises a third resistive portion (R3) operably disposed between the amplifier input and an output of the negation block wherein the corner frequency of the HPVGA is a function of a ratio between R2 and R3 and further wherein R2 and R3 maintain substantially proportional resistive values based upon the gain control input.

15. The HPVGA of claim 14 wherein the low pass filter and integrator comprises a second adjustable resistance block, a second amplifier and an adjustable capacitor block wherein the second adjustable resistance block is operably disposed between an output of the first amplifier and an input of the second amplifier and further wherein the adjustable capacitor block is operably disposed across an output of the second amplifier and the input of the second amplifier.

16. The HPVGA of claim 15 wherein the output of the second amplifier is further coupled to an input of the negation block.

17. The HPVGA of claim 16 further including logic for generating the gain control input.

18. The HPVGA of claim 16 further including logic for generating the control signals for the second resistance block and the adjustable capacitor block.

19. A method for adjusting gain of a high-pass variable gain amplifier comprises:
   changing a resistive value in a first input path of an amplifier to change an amplifier gain based upon a gain control input;
   changing a resistive value in a proportional amount in a second input path of an amplifier based upon the gain control input; and
   maintaining a substantially fixed frequency corner while increasing the restive value in the first and second input paths.

20. The method of claim 19 further including adjusting the frequency corner by adjusting a resistive value within a low-pass filtering block operably disposed within the second input path.

21. The method of claim 19 further including adjusting the frequency corner by adjusting a capacitive value within a low-pass filtering block operably disposed within the second input path.

* * * * *